United States Patent [19]

Znojkiewicz

[11] Patent Number: 4,556,852

[45] Date of Patent: Dec. 3, 1985

[54] MOUNTING A SEMICONDUCTOR DEVICE IN A MICROWAVE CAVITY OSCILLATOR

[75] Inventor: Maciej E. Znojkiewicz, Mount Royal, Canada

[73] Assignee: Northern Telecom Limited, Montreal, Canada

[21] Appl. No.: 533,356

[22] Filed: Sep. 19, 1983

[30] Foreign Application Priority Data

May 16, 1983 [CA] Canada .................................. 428269

[51] Int. Cl.[4] ............................................. H03B 7/12
[52] U.S. Cl. ................................ 331/96; 331/107 DP; 331/117 D
[58] Field of Search .............. 331/96, 107 R, 107 DP, 331/117 D

[56] References Cited

U.S. PATENT DOCUMENTS 4,021,755  5/1977  Svensson ...................... 331/107 DP Primary Examiner—Eugene LaRoche
Assistant Examiner—G. Wan
Attorney, Agent, or Firm—Thomas Adams

[57] ABSTRACT

A microwave cavity oscillator has a semiconductor device, for example a transistor for exciting the cavity to oscillate. The device is mounted upon a substrate which is itself mounted, conveniently soldered, upon a carrier which is releasably secured in a chamber adjacent the cavity. The carrier and substrate are mounted so that the device is coupled to the cavity via a hole extending therebetween and can be removed and installed as a sub-assembly to facilitate tuning and other adjustments in a test bed. In preferred embodiments one end of the carrier is located in spigot-and-socket fashion in a recess surrounding a hole communicating with the cavity. The other end of the carrier is urged by spring means to positively and accurately locate the carrier relative to the cavity. A part of the substrate extends through the hole and into the cavity. The transistor is mounted on the part within the hole and the part within the cavity serves as a capacitive coupling probe.

10 Claims, 4 Drawing Figures

MOUNTING A SEMICONDUCTOR DEVICE IN A MICROWAVE CAVITY OSCILLATOR

The invention relates to microwave cavity oscillators and in particular to mounting arrangements for mounting a semiconductor device, such as an excitation transistor, in a microwave cavity oscillator.

Embodiments of the invention are especially applicable to transistor mounting arrangements for negative resistance microwave cavity oscillators. In such oscillators the transistor is coupled to a probe which extends into the cavity. In known arrangements the transistor is soldered directly to the wall of the cavity with one of its leads trimmed to serve as the probe. This has not been entirely satisfactory for various reasons. For example, it is difficult to optimise the transistor circuitry when the transistor is installed, and usually not practical to adjust the transistor circuitry before installation because of changes in circuit parameters due to slight inaccuracies in the lengths of connecting leads, which are determined only during final installation.

Another problem arises from the soldered connection directly to the wall of the cavity. There is a tendency for dry joints to occur due to the large thermal mass to which the transistor is being soldered. It is also awkward to remove the transistor and its associated circuitry if adjustments or modifications need to be made.

The present invention seeks to mitigate these problems and to this end there is provided a microwave cavity oscillator comprising:
(i) a housing containing a cavity, a chamber adjacent the cavity and communicating therewith by way of a hole extending therebetween;
(ii) a carrier supported by the housing and carrying a substrate, supporting a semiconductor device, wherein the carrier is releasably secured to the housing so as to be readily removable complete with the substrate, and is mounted adjacent said hole such that said semiconductor device is coupled to the cavity by way of the hole.

An advantage of such an arrangement is that the carrier and substrate can be assembled into a test chamber duplicating the characteristics of the microwave cavity and chamber and circuit adjustments, such as fine RF tuning and DC bias adjustments can be carried out. The sub-assembly can then be transferred to the housing and no further adjustments will usually be required. If they are, the sub-assembly can be removed while they are made, which greatly facilitates adjustments.

The semiconductor device may be coupled to the cavity by a probe extending through the hole and a short distance into the cavity. The probe may be an extension of the substrate itself forming a flat capacitive coupling probe.

The carrier may be an elongate member located at one end spigot-and-socket fashion in a socket or recess in the wall surrounding the hole. Its opposite end may then be supported at the opposite wall of the chamber. Preferably spring means is provided at said opposite end for urging the carrier into the socket or recess, to abut against the bottom thereof or for a surrounding shoulder to abut against the wall surrounding the recess. This assures accurate axial positioning of the carrier and hence of the substrate, semiconductor device and probe (where applicable).

Support means for said opposite end of the carrier may comprise a screw-threaded bush engaged in a threaded hole in the said opposite wall of the chamber. The bush may be adapted at one end to supportingly engage the end of the carrier, conveniently in spigot-and-socket fashion, and adapted at the other end to engage a screwdriver, socket wrench or other such implement for screwing the bush into the hole.

Preferably the carrier is of generally segmented cylindrical form and the substrate is a planar member mounted upon the chordal surface of the carrier. One cylindrical end portion of the carrier is then in the form of a ring. The semiconductor device is mounted on a part of the substrate in the ring and conveniently soldered to the interior of the ring, which extends over the device. The ring grounds the device and serves also as a heat sink. The ring also acts as a shield to reduce the susceptibility to stray couplings affecting the tuning when the sub-assembly is substituted.

An embodiment of the invention will now be described by way of example only and with reference to the accompanying drawings, in which.

Figure 1:
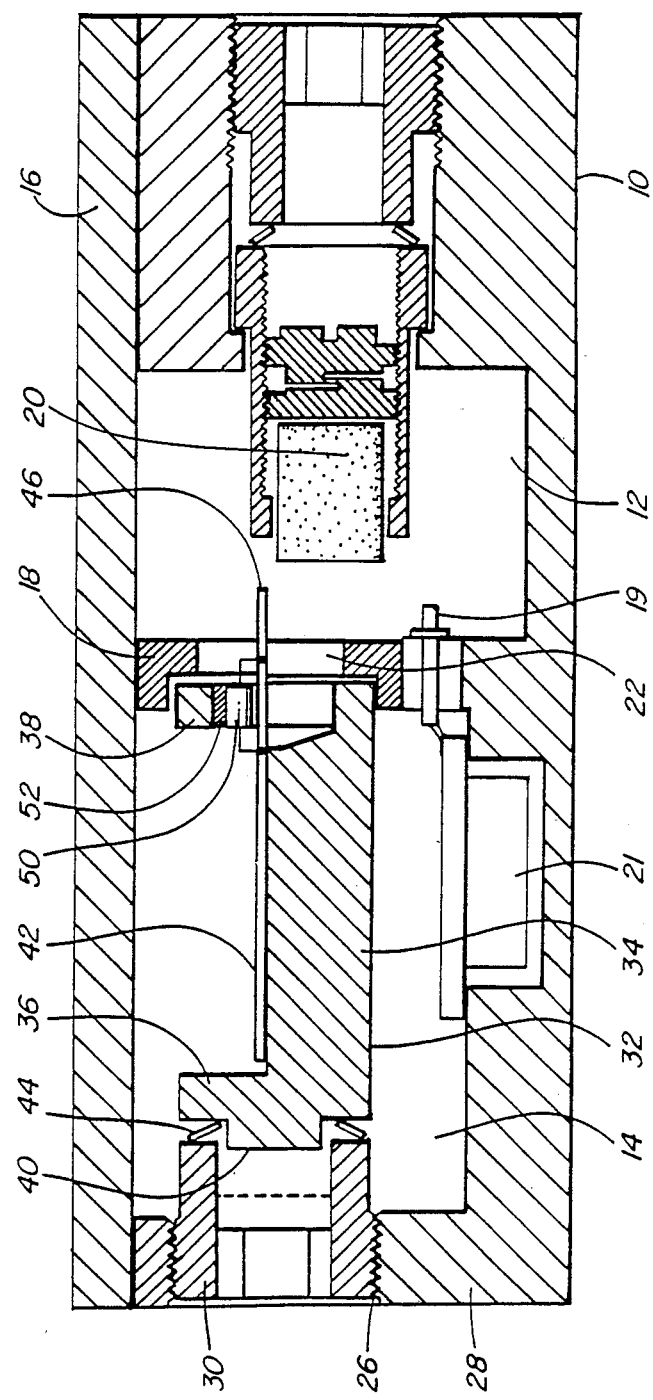
FIG. 1 is a cross-sectional elevation of a negative resistance microwave cavity oscillator including a sub-assembly comprising a carrier and a substrate.

Referring now to FIG. 1, the negative resistance cavity oscillator comprises an elongate block of aluminum 10 having a cavity 12 and a chamber 14 formed side-by-side within it and both opening onto the same one of the elongate surfaces of the block 10. A plate 16, also of aluminum, is affixed to that surface by any suitable means to seal the chamber 14 and the cavity 12. The cavity 12 and chamber 14 are of parallelepiped shape and separated by a dividing wall 18. A tuner 20 protrudes into the cavity from its sidewall opposed to the dividing wall 18. The tuner 20 does not comprise part of the present invention and so is not described in detail. It is the subject of copending patent application Ser. No. 532,388, allowed Mar. 4, 1985. An output probe 19 extends through wall 18 and is coupled in chamber 14 to a drop-in isolator 21 in a recess in the bottom of chamber 14.

Figure 2:
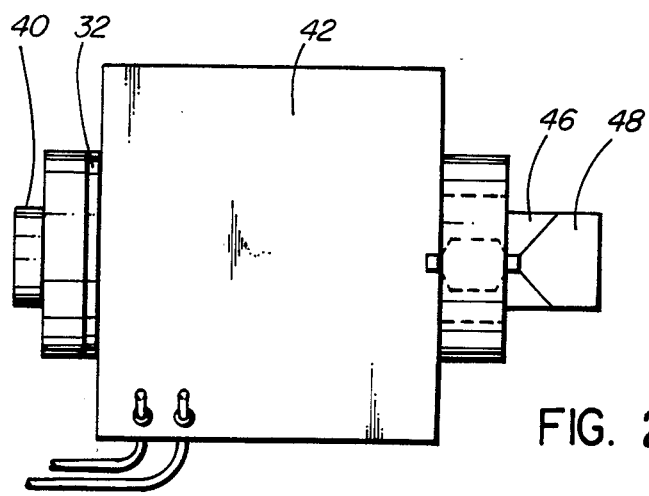
FIGS. 2, 3 and 4 are plan, side and end elevations, respectively, of the sub-assembly.
Figure 3:
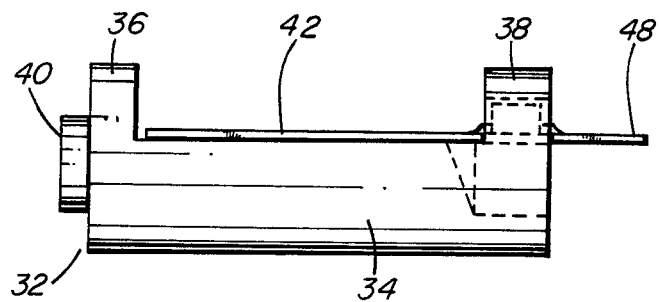
Figure 4:
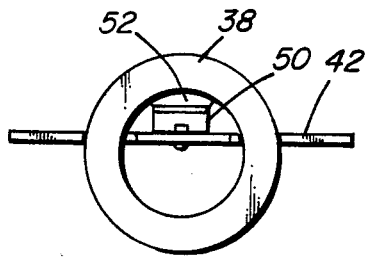

A round hole 22 extends through the wall 18 at a position slightly more than half way from the base of the chamber 14. The surface of wall 18 in the chamber 14 has a circular recess 24, in the form of a counterbore, around the hole 22. A hole 26, coaxial with hole 22, extends through the end wall 28 of chamber 14, i.e. the wall opposite to dividing wall 18. The hole 26 is screwthreaded and an externally screwthreaded bush 30 is engaged in the hole 26. Suspended between the bush 30 and recess 24 is a carrier member 32. As shown also in FIGS. 2, 3 and 4, the carrier 32 has a segmented, specifically semi-cylindrical, portion 34 extending for most of its length and terminating in short, full-cylindrical end portions 36 and 38, respectively. The end surface of end portion 36 is formed with a spigot 40, dimensioned to fit snugly in the end of an axial hole 42 through the bush 30. A conical spring washer 44 is shown (FIG. 1) fitted over the spigot 40 to act between the annular end surfaces of the bush 30 and end portion 36, respectively. The opposite end portion 38 is a snug fit in the recess 24 in the dividing wall 18. The carrier 32 is made of gold-plated brass, or any other suitable material.

The carrier member 32 carries a substrate 42 in the form of a plate of dielectric material copperplated both sides. The substrate 42 comprises a rectangular part 44 which rests upon the planar chordal surface of semi-cylindrical portion 34 of carrier 32, and overhangs its diameter. The substrate 42 is soldered to the carrier 32. A small rectangular extension 46 extends from the middle of that edge of the substrate portion 44 adjacent the carrier end portion 38. End portion 38 is hollowed so as to form a ring. The substrate extension 46 extends through the ring and its extremity projects a short distance beyond the end of the carrier 32 and into the cavity 12. This extremity portion is plated, preferably both sides to form a flat capacitive coupling probe 48.

The substrate 42 carries a microwave semiconductor device in the form of transistor 50, in common collector package, which serves to excite the cavity 12 to oscillation. The substrate also carriers associated circuit components such as RF tuning and DC bias circuitry (not shown). RF biasing chokes and decoupling capacitors are printed on the substrate. DC biasing and filtering components are mounted on the substrate after it has been soldered to the carrier 32. The transistor 50 is mounted on the part of the substrate 42 inside the ring 38. The transistor 50 has its base connected to the probe 48 and its emitter connected to the above-mentioned circuitry, which is carried by the main portion 44 of the substrate 42. The collector of the transistor is connected to ground simply by soldering the body of the transistor directly to the adjacent underside of the ring 38, as at 52. When the carrier 32 is installed in the chamber 14 the transistor 50 will be adequately grounded through the mechanical connection between the carrier 32 and the body of the apparatus, which connecton also helps to dissipate heat.

In use, the carrier may readily be installed by locating the end portion 38 in the recess 24 and screwing the bush 30 into the chamber 14 to locate on the spigot 40. The outer end of the hole 42 is formed hexagonally to receive a suitable key to rotate the bush 30. As the bush is further screwed in, it compresses the conical washer which urges the carrier 32 firmly and positively into the desired position. Accurate location of the carrier results from its end abutting firmly against the wall 18. This also provides corresponding accurate location of the transistor 50 and probe 48 relative to the cavity 12.

An advantage of the described mounting arrangement is that it combines multiple functions, namely transistor mounting, heat sinking, RF coupling, RF tuning, DC biasing and filtering in a simple, compact, low-cost assembly. Moreover, tuning can readily be effected by filing the end of the probe or by adding solder to it.

The specific embodiment is intended for use with bipolar transistors operating in the 4 and 6 GHz communication bands. It is envisaged, however, that the arrangement could be used with other semiconductor devices, for example field effect transistors or two terminal devices such as Gunn or Impatt diodes; and at other frequencies.

What is claimed is:

1. A microwave cavity oscillator comprising:
   (i) a housing containing a cavity, a chamber adjacent the cavity and communicating therewith by way of a hole extending therebetween;
   (ii) a carrier supported by the housng and carrying a substrate, supporting a semiconductor device, wherein the carrier is releasably secured to the housing so as to be readily removable complete with the substrate, and is mounted adjacent said hole such that said semiconductor device is coupled to the cavity by way of the hole.

2. An oscillator as defined in claim 1, wherein the carrier has one end positively located in a recess adjacent said hole and is supported at a position spaced longitudinally from such one end by means serving to support the carrier and to urge the carrier into said recess.

3. An oscillator as defined in claim 2, wherein means serving to urge the carrier comprises a member screw-threadedly engaging in a screw-threaded hole in the opposite wall of the chamber and spring means acting axially between said member and the end of the carrier.

4. An oscillator as defined in clam 3, wherein said end of the carrier has a spigot and said member comprises a bush, the spigot being slidably located in the internal end of the bush and the spring means being a spring washer on the spigot acting between the carrier and the bush.

5. An oscillator as defined in claim 1, wherein the carrier has a ring-shaped end portion aligned with said hole and the substrate has a part extending through said ring-shaped end portion.

6. An oscillator as defined in claim 5, wherein the semiconductor device is mounted upon the part of the substrate within the ring-shaped end portion.

7. An oscillator as defined in claim 6, wherein the semiconductor device is connected to the ring.

8. An oscillator as defined in claim 1, wherein the semiconductor device is soldered bodily to the ring.

9. An oscillator as defined in claim 1, wherein said substrate part has an extremity portion extending in the cavity to serve as a probe.

10. An oscillator as defined in claim 9, wherein said extremity portion is plated to form a capacitive coupling probe.

* * * * *